United States Patent [19]
Lowe

[11] 4,215,351
[45] Jul. 29, 1980

[54] CHART RECORDERS

[75] Inventor: David J. Lowe, Sheffield, England

[73] Assignee: National Research Development Corporation, London, England

[21] Appl. No.: 944,559

[22] Filed: Sep. 21, 1978

[30] Foreign Application Priority Data

Oct. 5, 1977 [GB] United Kingdom ............... 41486/77

[51] Int. Cl.² ...................... G01D 15/24; G01D 9/00; G01D 15/16
[52] U.S. Cl. ..................................... 346/136; 346/65; 346/113
[58] Field of Search ................ 346/136, 76 R, 76 PH, 346/65, 113

[56] References Cited

U.S. PATENT DOCUMENTS

| | | | |
|---|---|---|---|
| 2,228,883 | 1/1941 | Morgan | 346/65 |
| 2,647,033 | 7/1953 | Faus | 346/76 R |
| 2,890,924 | 6/1959 | Norfolk, Jr. | 346/113 |
| 3,245,083 | 4/1966 | Wilson et al. | 346/136 X |
| 3,965,434 | 12/1960 | Downs | 346/136 X |
| 4,017,868 | 4/1977 | Keating | 346/76 PH X |

Primary Examiner—George H. Miller, Jr.
Attorney, Agent, or Firm—Blanchard, Flynn, Thiel, Boutell & Tanis

[57] ABSTRACT

In a potentiometric chart recorder, the speed of the chart motor 22 is, in one mode of operation (AUTO) selected by a switch 32, varied between two values in dependence upon the rate of change or slope of the input signal at 10 as detected in a detector 30. The slow speed is obtained by intermittent operation at the fast speed, and during the non-operative periods power-consuming circuitry e.g. 16, 18, 26 is switched off by a switch 40.

17 Claims, 5 Drawing Figures

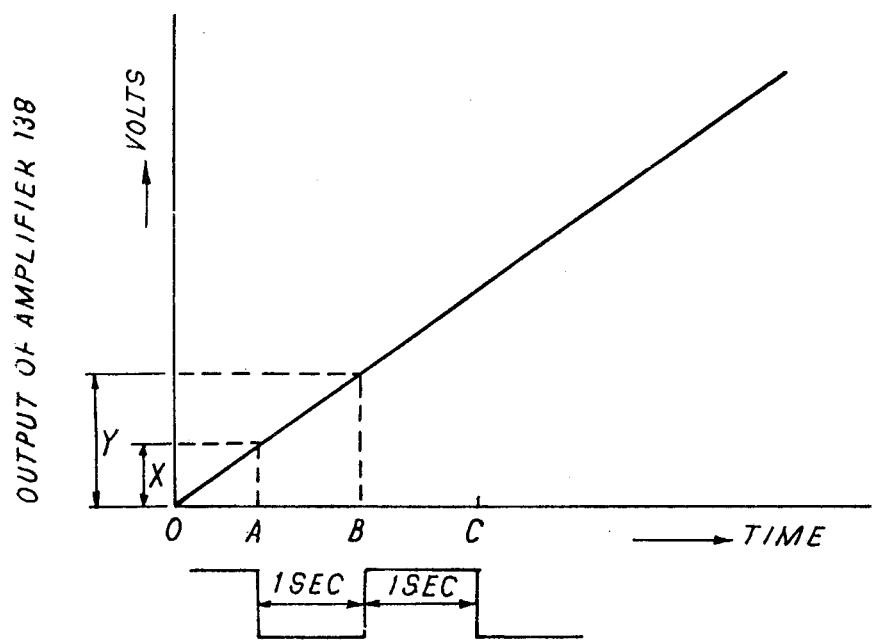

CHART RECORDERS

This invention relates to chart recorders.

A typical chart recorder provides a record on a long roll or length of paper of the variation of the magnitude of an electrical signal with time. It has two motors, the first of which is the chart motor and moves the paper along at a controlled rate. The second is the pen servo motor and moves a pen transversely across the chart to a position representing the instantaneous value of the input signal.

It is commonly possible to switch the speed of the chart motor between two or three values to take account of different anticipated types of variation in the input signal. However, it is not always possible to predict accurately what changes are likely to occur in the signal. Also, the changes may be such that they are rapid but occur infrequently, and much motor power and paper is then consumed during the intervals between changes. In the case of a battery-operated recorder, this is particularly disadvantageous.

According to this invention I provide a chart recorder for providing a record of the variation of a value with time, comprising an input terminal for receiving an electrical input signal a value of which is to be recorded, first drive means for relatively moving a length of record medium past a recording member at a selectable controlled rate, and second drive means connected to the input terminal for relatively moving the recording member across the record medium to a position dependent upon the said value of the input signal, wherein, at least in one mode of operation of the recorder, the first drive means is connected to the input terminal and is responsive to the input signal in such a manner that the rate at which the record medium is relatively moved past the recording member is automatically dependent upon a characteristic of the said input signal.

In a preferred embodiment of the invention the value of the signal which is recorded is its magnitude, and the characteristic of the signal which determines the rate at which the first drive means relatively moves the record medium past the recording member is the rate of change of the said magnitude.

Conveniently the first drive means can switch between two rates in dependence upon whether the rate of change of the input signal is above or below a predetermined rate. To provide a visual indication of the rate used, when in a selected one of the two rates a warning signal can be added periodically to the input signal as applied to the second drive means.

In the preferred embodiment of the invention which is described in more detail below, the first drive means switches between a fast speed and a slow speed, and the slow speed is obtained by intermittently operating the recorder at the fast speed. When in the slow speed condition, during the non-operative periods much of the recorder circuitry can be switched off, with considerable power saving resulting.

The invention will now be described in more detail, by way of example, with reference to the drawings, in which.

Figure 3:
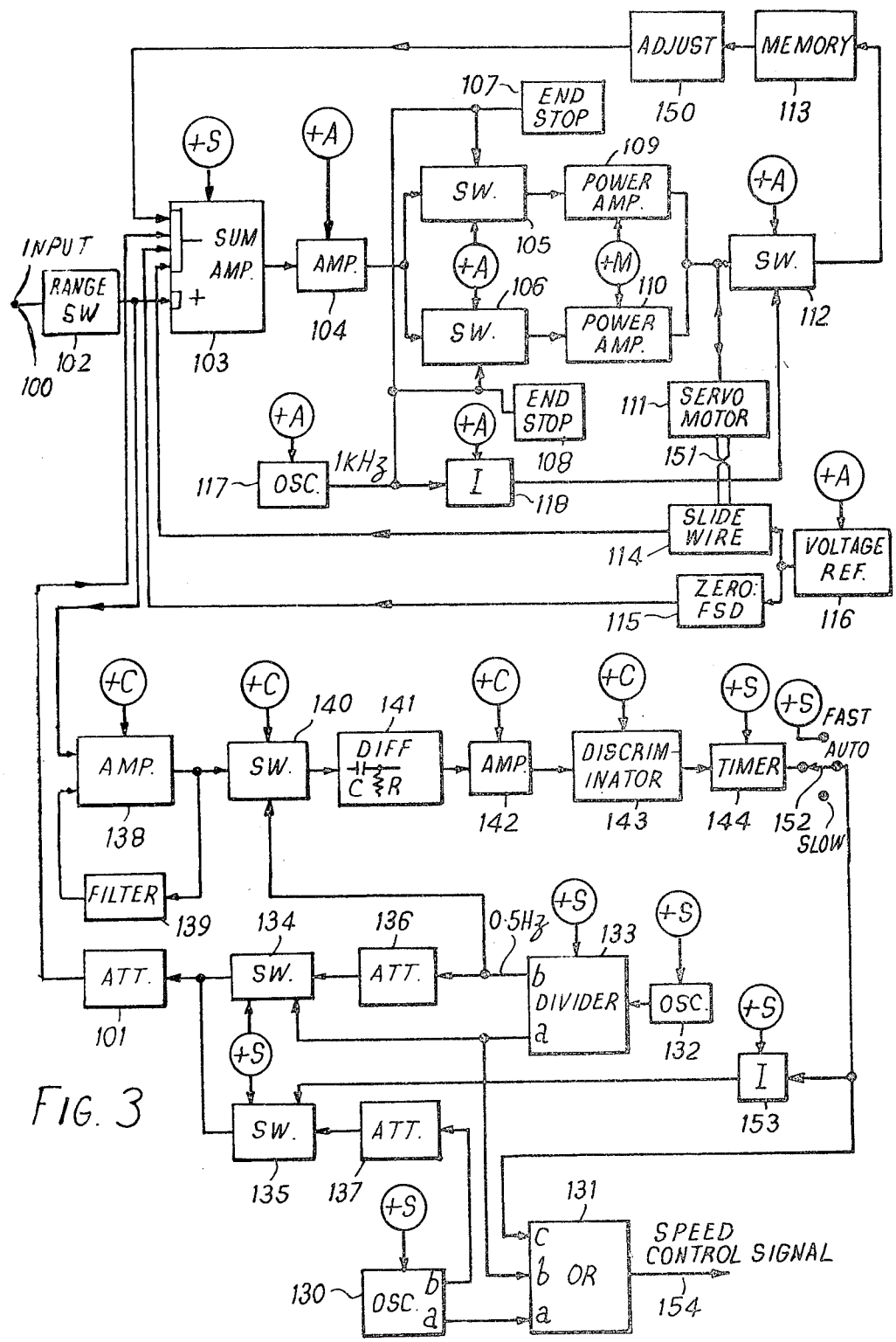
Figure 4:
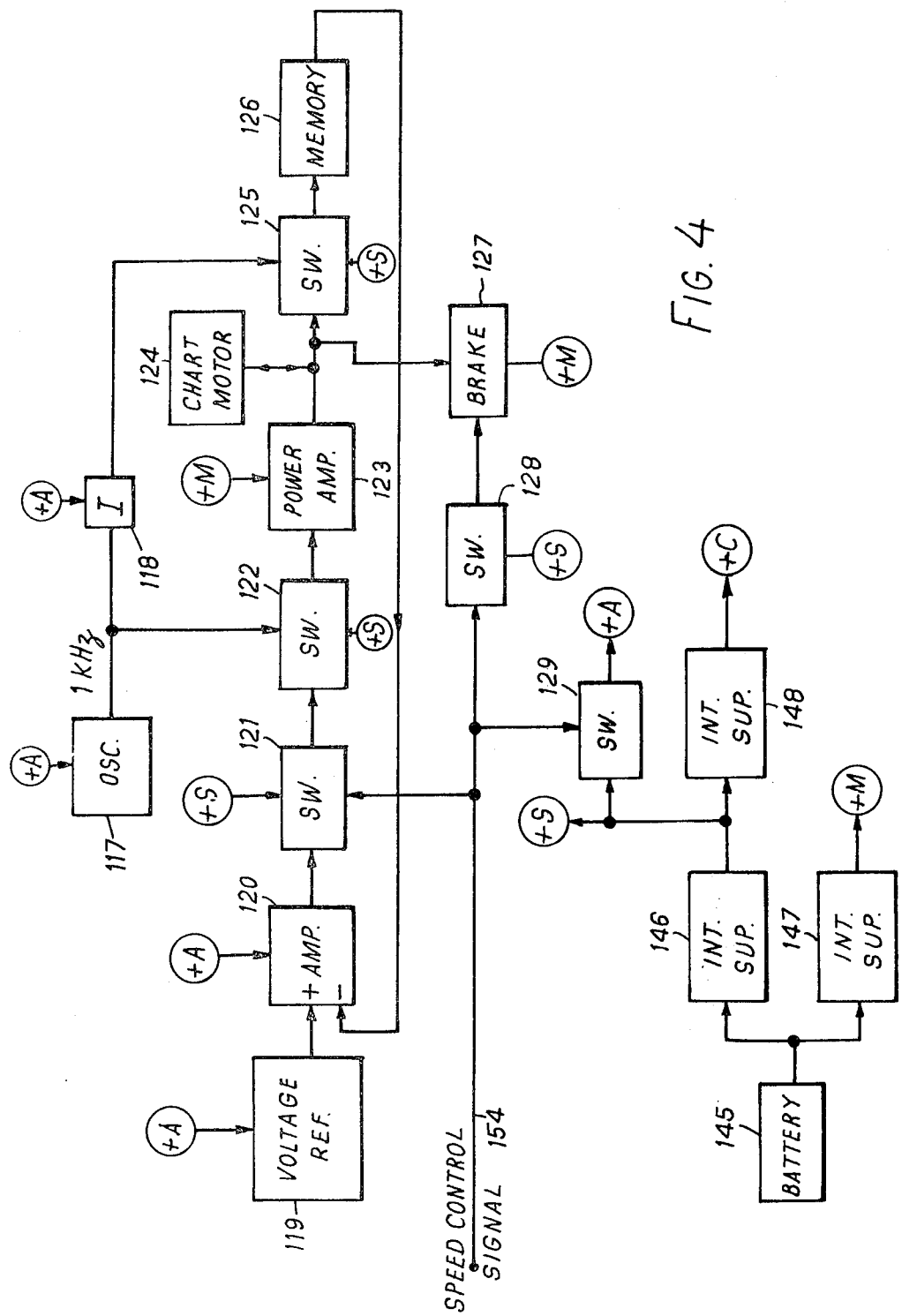

FIGS. 3 and 4 together form a block circuit diagram of a preferred chart recorder embodying the invention, in which FIG. 3 shows the pen servo control circuits and the circuits for generating a speed control signal, and FIG. 4 shows the chart motor control circuits and the power supply circuits; and FIG. 5 is a graph illustrating the operation of part of the slope detector of FIG. 3.

Figure 1:
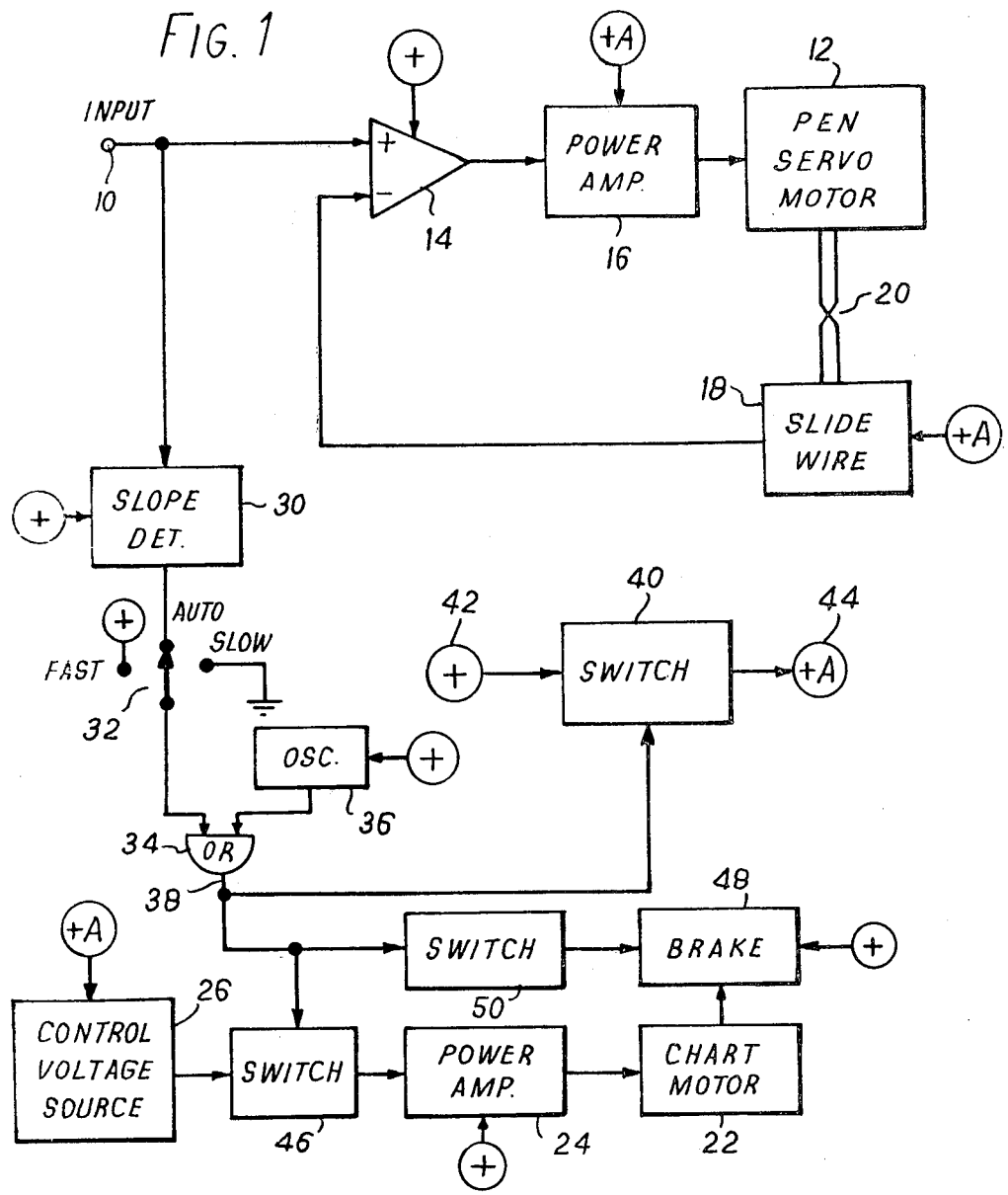
FIG. 1 is a block circuit diagram of certain components of a chart recorder embodying the invention to illustrate the manner in which automatic speed control can be obtained.

Reference should first be made to FIG. 1, which is included to illustrate some important features of the preferred embodiment of FIGS. 3 and 4. In FIG. 1 a chart recorder includes an input terminal 10 for receiving a signal the magnitude of which is to be recorded by the recorder. This signal is applied to a pen servo motor 12 via a control loop which includes a summing amplifier 14 the non-inverting input of which is connected to input 10, and the output of which is connected to a power amplifier 16 in turn connected to the servo motor 12. The slider of a potentiometric slide wire 18 is mechanically coupled, as indicated at 20, to the servo motor 12, and the electrical output thereof is applied to the inverting input of amplifier 14.

In this way the servo motor 12 will tend to move the pen to a position representing the instantaneous value of the input signal, such that the output of the amplifier 14 is zero.

The chart of the recorder is driven lengthwise by a chart motor 22 powered from a power amplifier 24 at a rate proportional to the voltage from a stabilised voltage source 26.

As thus-far described the recorder is typical of many known recorders. However, in accordance with this invention a slope detector circuit 30 is also connected to the input terminal 10. This circuit senses the rate of change of the input signal and when this rate of change exceeds a predetermined value (whether positive or negative) provides a high output signal.

A manually-operable selector switch 32 has three positions, namely FAST, AUTO, and SLOW. When in the FAST position it receives a high or 1 signal. When in the SLOW position it receives a low or 0 signal. When in the AUTO position it receives the output of the slope detector 30, which as seen from above is 1 when the input signal changes rapidly and 0 when it changes slowly.

Thus the output of switch 32 indicates whether the chart motor should operate at its fast or its slow speed. It would be possible to apply the output of switch 32 to the voltage source 26 to cause it to vary between a high and a low value. However, to conserve battery power it is preferred to use the output of switch 32 differently. This output is as shown connected to one input of an OR gate 34 to another input of which is connected the output of an astable oscillator 36. This oscillator cycles between two conditions with a mark-space ratio of 1:9. Thus the output of OR gate 34 will be high if:

switch 32 is in its FAST position; or
switch 32 is in its AUTO position and the output of detector 30 is high; or
switch 32 is in its AUTO or SLOW position and the output of oscillator 36 is high.

It will therefore be seen that when the fast chart speed is required, the output of OR gate 34 is high continuously, but when the slow speed is required the output of OR gate 34 is high for one-tenth of the time. The slow speed will therefore by one-tenth of the fast speed.

The control signal at the output 38 of the OR gate 34 is applied to three switching circuits. The first switching circuit 40 is connected to the power source battery 42 to provide an auxiliary power source rail 44 which is used to power much of the circuitry. Circuits powered directly from the battery are shown by having a circle containing a plus sign ⊕ associated with them, while circuits powered from the switched auxiliary rail 44 are shown by having a circle containing "plus A" ⊕A associated with them.

Thus power amplifier 16 is powered from the switched rail +A. Therefore when the control signal 38 is low there will be essentially no power consumption by the pen servo motor 12. The slide wire 18 is also powered only when actually in use.

Similarly the voltage source 26 for the chart motor 22 is powered from the switched rail. Here, however, we find it desirable to include a switch or gate circuit 46 between the source 26 and the power amplifier 24 which is opened (rendered non-conductive) when the control signal 38 is low. A dynamic brake 48 for the chart motor 22 is activated by a further switching circuit 50 when the control signal 38 becomes low. These measures ensure that the chart motor is stopped quickly, despite its inertia.

Before turning to a description of the more detailed FIGS. 3 and 4, reference will first be made to FIG. 2 which shows a motor control circuit which can be used with either the pen servo motor or the chart motor. In this circuit, the input voltage represented by block 60 may be either the recorder input 10 or the output of source 26. This voltage is applied to the non-inverting input of a summing amplifier 62. The output of amplifier 62 is connected to the motor 64 through a switch 66 and a power amplifier 68. A memory circuit 70 is also connected to the motor 64 through a switch 72, and has an output connected to the inverting input of amplifier 62.

The switches 66 and 72 are closed alternately. An oscillator 74 is connected directly to switch 66 and through an inverter 76 to switch 72. The oscillator is an astable oscillator, which has a mark-space ratio of say 9:1. Thus for nine-tenths of the time the motor 64 will be powered by the power amplifier 68 in accordance with the output of the amplifier 62, but at intervals it will be connected to the memory circuit 70. During these intervals the motor will provide an output voltage which is proportional to its speed, and this voltage will be stored in the memory as a speed-representative signal. This voltage is continuously applied by the memory circuit 70 to the amplifier 62 as a velocity control signal.

It should be noted that when this velocity control circuit is used with the chart motor 22 as the motor 64, the frequency of oscillator 74 will be many times greater than that of the oscillator 36 of FIG. 1.

The preferred chart recorder shown in FIGS. 3 and 4 will now be described in detail. This recorder embodies the features described with reference to FIGS. 1 and 2, and also has several other desirable features. The preferred chart recorder is designed as a portable recorder to run from batteries, with low power consumption.

An input terminal 100 is connected to a manually-operable voltage range switch 102 which includes an attenuator which can selectively be switched into circuit to select the appropriate range. The output of the switch 102 is applied to the non-inverting input of a summing amplifier 103, where it is compared with the output of a position-controlled potentiometric slide wire 114 which is connected to the inverting input of the amplifier 103. The difference between its inputs is multiplied by a factor of 2000 in the amplifier 103 and applied to a voltage amplifier 104, which has a gain of two. The output of amplifier 104 is applied through respective analogue switches 105 and 106 to two power amplifiers 109 and 110 which are connected in push-pull, that is amplifier 109 is used for positive signals from amplifier 104 and amplifier 110 for negative signals. These amplifiers 109 and 110 between them supply a drive voltage for a pen servo motor 111 which moves the pen across the chart towards the required position. The servo motor 111 also moves the sliding contact of the slide wire 114, thus tending to reduce the difference signal at the input of the summing amplifier 103. When the pen reaches the position which represents the input signal, the output from the slide wire 114 balances the input signal and the output of amplifier 103 is zero.

Figure 2:
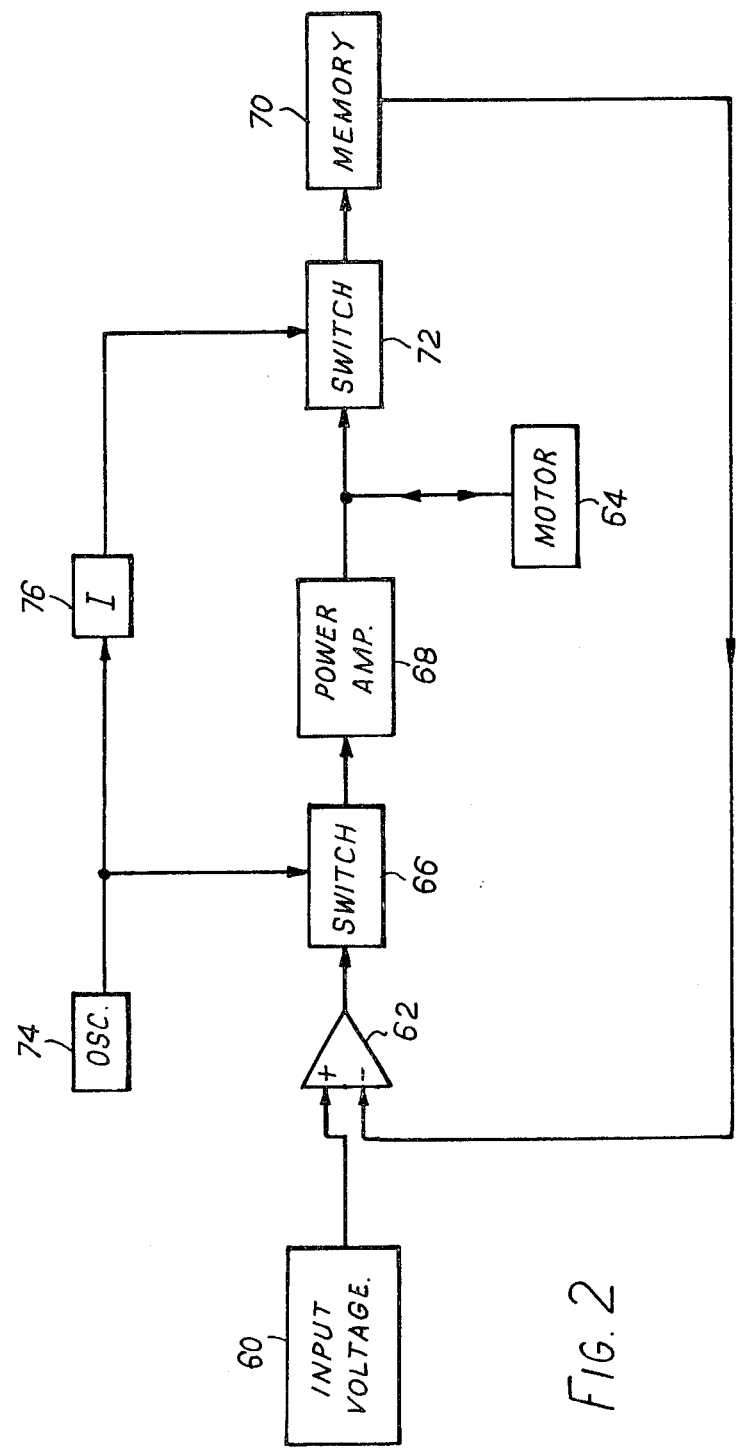
FIG. 2 is a block circuit diagram of a motor control circuit which can be used in the recorder.

The servo loop is stabilised by a velocity feedback signal along the lines of FIG. 2. The analogue switches 105 and 106 are operated together by an astable oscillator 117, which runs at a frequency of 1 kHz and has a mark-space ratio of 9:1. The output of oscillator 117 is also inverted in a digital inverter 118, and the inverter output is applied to a further analogue switch 112 which is connected between the servo motor 111 and an analogue memory circuit 113. An adjustable proportion of the output of the memory 113 is selected by a circuit 150 and applied to the inverting input of the summing amplifier 103.

It will be seen that the velocity control loop thus formed operates as described with reference to FIG. 2. The oscillator 117 runs at a frequency of 1 kHz and has a mark-space ratio of 9:1. When the output of oscillator 117 is high, analogue switches 105 and 106 are closed (conductive) and analogue switch 112 is open, due to the inverter 118. At this time the servo motor 111 is being driven from the summing amplifier 103, and its speed of movement will depend upon the signals from the slide wire 114, the input 100 via range switch 102, and the analogue memory 113 via the preadjusting circuit 150. The input of memory 113 is however disconnected from the motor 111 by switch 112. When the output of oscillator 117 is low, switches 105 and 106 open, and switch 112 closes, so that the motor 111 is now connected to the input of memory 113 and not to the drive amplifiers 109 and 110. In this state the motor 111 acts as a tacho-generator and provides an output voltage which is proportional to its instantaneous speed, and this voltage is stored in the memory 113 via the closed switch 112. This stored voltage is used to damp the pen movement during the subsequent high output of oscillator 117. Adjustment 150 is provided for presetting during manufacture but will not normally be altered during use.

The mechanical connection of the servo motor 111 and potentiometric slide wire 114 is indicated at 151. The slide wire is supplied from a reference voltage source 116, which also supplies a dual manual control 115 connected to the inverting input of amplifier 103. This enables the zero and full scale deflection of the recorder to be manually adjusted.

Also mechanically associated with the pen are two switches 107 and 108 which operate as end stops. Switch 107 is located just above the full scale deflection (FSD) position of the pen and switch 108 is located just below the zero position. The switches are normally open but are closed when the pen exceeds the range of the recorder and passes the FSD or zero position respectively. Conveniently the pen acts as the earth terminal of the switch. Considering switch 107, when the switch closes it in turn opens switch 105, thus disconnecting the power amplifier 107. The pen thus does not try to move beyond the limit position, even though the output of amplifier 104 is still positive. When the input signal comes back into range the output from amplifier 104 will become negative, and this signal will be applied through the still-closed switch 106 to power amplifier 110 to drive the pen away from the limit position. Switch 107 will now re-open and the recorder will operate normally again. Thus over-ranging of the input signal is accommodated electronically, with the advantage that the pen can be rigidly coupled to the servo motor 111 as at 151.

Conversely, in the case of under-ranging, switch 108 is closed causing switch 106 to open. When the signal comes back into range switch 105 and power amplifier 109 drive motor 111 to move the pen away from the end stop 108.

As with the recorder of FIG. 1, the chart can be driven in three modes, FAST, AUTO, or SLOW. The selection between the three modes is made manually by a selector switch 152 which in its FAST position is connected to a positive voltage, in its SLOW position is connected to earth, and in its AUTO position receives a voltage which indicates whether or not the rate of change of the input signal exceeds a predetermined rate of change. The generation of this signal will be described first.

The input signal slope detection circuitry includes an amplifier 138 connected to the output of the range switch 102 whcih receives the input signal at terminal 100. A switched filter 139 is connected across the amplifier 138 as shown so as to improve the signal-to-noise ratio. The filtered signal is applied to an analogue switch 140 which operates in conjunction with a differentiator circuit 141 to form an incremental differentiator. Switch 140 receives a 0.5 Hz signal from a divider 133 (described below) and is switched on and off by this signal. FIG. 5 illustrates the operation of the switch 140 and differentiator 141 in the presence of a steadily rising signal from amplifier 138. From point O to point A the switch 140 is closed and the voltage stored in the capacitor C of the differentiator 141 follows the input voltage. At point A the switch 140 opens so that the capacitor now holds the instantaneous voltage x at point A until point B. At point B, one second later, the switch 140 is again closed, and the difference between the instantaneous input voltage y and the stored voltage x produces a voltage pulse across the resistor R of the differentiator 141, which has a peak height proportional to the difference between the voltages x and y. This voltage will decay rapidly to zero because the time constant of the RC network is negligible compared with the 1 second pulses of the control signal. Therefore at time C the voltage stored across the capacitor will again be equal to the voltage at the output of amplifier 138. The cycle will now repeat. Since the difference between the voltages x and y has been obtained in a fixed period of one second, the voltage pulse output is a measure of the incremental slope of the input signal.

The incremental differentiator thus formed can be capable of differentiating frequencies as low as 0.001 Hz.

The signal from the differentiator 141 is amplified in a voltage amplifier 142 and applied to the input of a double discriminator 143, which is capable of detecting both positive and negative levels greater than a preset value. If the signal from differentiator 141 is greater than this value the discriminator switches on a resettable timer or monostable circuit 144. This circuit, when triggered, provides a high output for a predetermined period of typically one minute. This overcomes the problem of the slope detector switching the recorder to the slow speed whenever the peak of a waveform occurs. Thus for as long as the incremental slope of the input signal remains in excess of the preset value, and for one minute thereafter, the output of the timer 144 is high. At other times it is low. The output of timer 144 is applied to the AUTO contact of switch 152.

Thus under all circumstances the output of switch 152 indicates whether the fast or slow chart motor speed is required. As with FIG. 1, the fast speed is obtained by operating the chart motor continuously, while the slow speed is obtained by operating the chart motor at the same instantaneous speed as in the fast mode but only for one-tenth of the time. To this end, an astable oscillator 130 produces at an output a a 0.2 Hz signal with a mark-space ratio of 1:9 which is applied to one input a of an OR gate 131. The output of the switch 152 is applied to another input c of the OR gate 131. These two signals thus produce at the output 154 or OR gate 131 a go/no go type of speed control signal for the chart motor which is high during those intervals when the chart motor is required to operate. The manner in which this signal is used is described with reference to FIG. 4.

To allow easy identification of the chart motor speed on the trace, a "hash" signal consisting of a plus and minus 2 mV square wave is added to the input of the recorder whenever the chart motor is operating at its slow speed. This thickens the trace formed by the pen. To this end a 0.1 Hz signal is produced at the output b of oscillator 130 and applied via an attenuator 137 to a switch 135. This switch is operated by a control signal obtained by inverting the output of switch 152 in an inverter 153. When the signal from switch 152 indicates that the slow chart speed is required, switch 135 is closed to apply the signal from oscillator 130 to the inverting input of summing amplifier 103, via a further attenuator 101. When the fast chart speed is required, switch 135 is opened.

The frequency of the output b of oscillator 130 is half that at its output a, so that the sign of the hash signal will alternate for each high on the a output of oscillator 130.

An indication of elapsed time is provided on the trace to enable identification of when an event occurs by adding a plus and minus 50 mV signal to the recorder input every half hours. A suitable oscillator 132 feeds a divider 133 which, as described above, produces a 0.5 Hz signal at an output b. At another output a, it provides a 2-second wide pulse every half hour. This pulse is applied to control a switch 134 which receives the 0.5 Hz signal from output b of the divider via an attenuator 136. Thus switch 134 provides a 2-second pulse of a 0.5 Hz signal, i.e. one cycle of the signal, every half hour. This signal is applied to the attenuator 101 to be added to the inverting input of amplifier 103.

It is necessary to ensure that the chart motor is running during the occurrence of this timer pule otherwise it would not appear properly on the chart, and therefore the a output of divider 133 is also applied to an input b of the OR gate 131.

Reference should now be made to FIG. 4 which shows the remaining circuits in the recorder. The chart motor 124 is controlled by a "velodyne" control circuit which includes a velocity control loop of the type shown in FIG. 2. The previously-mentioned oscillator 117 and inverter 118, shown again in FIG. 4 for convenience, operate respectively on switches 122 and 125 to open and close them alternately, with switch 122 closed for nine-tenths of the time and switch 125 closed for one-tenth of the time. Switch 125 connects the input of a memory circuit 126 to the chart motor 124 to receive a speed-dependent voltage which is compared in an amplifier 120 with the fixed output of a reference voltage source 119. Any difference between these two signals, indicating a speed error, is amplified and applied first through a switch 121 and then via the switch 122 and a power amplifier 123 to drive the chart motor 124. The reference voltage can be adjusted by means of a trimmer potentiometer (not shown) to control the fast speed to the desired value.

As noted above, the slow chart speed is achieved by operating the chart motor intermittently. The go/no go speed control signal on line 154 is for this purpose applied to a dynamic brake 127 connected to the chart motor 124, via an analogue switch 128. The arrangement is such that when the signal on line 154 is low, indicating that the motor should be stopped, the brake 127 is activated. To inhibit the velocity control loop from trying to drive the chart motor, the siwtch 121 is opened in response to a low signal on line 154.

The signal on line 154 is also applied to a switch 129 in the power supply circuits, which are arranged as follows. The primary power source, which is shown as a battery 145, supplies a motor power rail +M via fusing and interference suppression circuitry 147. This source supplies the power amplifiers 109, 110 and 123, as well as the dynamic brake 127. These circuits are shown as being so powered by the indication (+M) associated with them. The battery 145 also supplies an electronic power rail +S via fusing and interference suppression circuitry 146. A further interference suppressor 148 is connected to the +S rail and supplies a stabilised rail +C. Finally the switch 129 is connected to the +S rail and supplies a switched auxiliary rail +A in accordance with the go/no go speed control signal on line 154.

The manner in which the principal electronic circuits are powered is indicated on FIGS. 3 and 4 by the indications (+S), (+C) and (+A) associated with the circuits. It will be seen that the slope detector circuits use the stabilised rail +C. Of the remaining circuits, those circuits which consume any substantial power and which are only required to operate when the chart motor is actually operating use the switched +A rail. These include the reference voltage sources 116 and 119, amplifiers 104 and 120, switches 105, 106 and 112, oscillator 117 and inverter 118. When switch 129 is opened, the signals to the power amplifiers 109, 110 and 123 are thus seen to fall to zero.

Other circuits which are required to operate continuously, or where power consumption is insignificant, use the +S rail.

It will be appreciated that each of the above-mentioned rails may consist of one or more positive and one or more negative rails.

The recorder described has many advantages. These include the fact that it can operate for long periods without attention, and is intrinsically safe to the British Standard B.S. 1259: 1958. Being potentiometric it is comparatively insensitive to vibration or position (attitude).

When operating in the AUTO mode, the recorder uses little power or paper when the input signal is relatively inactive. If the input signal starts to change rapidly, however, the recorder will switch into its fast speed. An indication is given on the trace as to whether the recorder was operating in its fast or slow speed, and timing marks are included periodically.

I claim:
1. A chart recorder, comprising:
   an input terminal for receiving an electrical input signal a value of which is to be recorded;
   first drive means for relatively moving a length of record medium past a recording member at a selectable controlled rate; and
   second drive means connected to said input terminal for relatively moving the recording member across the record medium to a position dependent upon the said value of said input signal;
   wherein the improvement comprises means which at least in one mode of operation of the recorder connects said first drive means to said input terminal such that said first drive means is responsive to said input signal, for making said rate, at which the record medium is relatively moved past the recording member, automatically dependent upon the slope of said input signal.
2. A recorder according to claim 1, wherein said value of said input signal is its magnitude, said slope being the rate of change of said magnitude.
3. A recorder according to claim 1, wherein said second drive means includes a motor rigidly connected to the recording member, and including limit switches for disabling said motor upon actuation of the limit switches.
4. A recorder according to claim 1, wherein said second drive means includes a potentiometric position sensor.
5. A chart recorder according to claim 1, including means for detecting the slope of the input signal by periodically sampling the input signal and comparing successive samples.
6. A recorder according to claim 1, wherein at least one of said drive means includes a drive motor with a velocity control circuit.
7. A recorder according to claim 6, wherein said velocity control circuit comprises a memory circuit having an input connected to said motor through a first switch and an output connected to a comparator which also receives a motor control signal, the comparator output being applied to said motor through a second switch and a power amplifier, wherein said first and second switches are closed alternately.
8. A recorder according to claim 1, wherein said first drive means is adapted to switch between two or more predetermined rates in response to the slope of said input signal.
9. A recorder according to claim 8, including manually-operable means for disconnecting said first drive means from said input terminal and causing the record medium to be relatively moved past the recording member at a selected constant speed.
10. A recorder according to claim 8, including means responsive to said first drive means operating at a selected rate to provide a visual indication thereof on the record.

11. A recorder according to claim 10, wherein said last-mentioned means applies an oscillatory signal to the second drive means to vary the width or thickness of the record.

12. A recorder according to claim 8, wherein said first drive means switches between a fast speed and a slow speed, and the slow speed is obtained by intermittently operating the recorder at the fast speed.

13. A recorder according to claim 12, wherein, when in the slow speed condition and during the non-operative periods, at least some of the recorder circuitry is disconnected from its power supply.

14. A recorder according to claim 12, including means causing the second drive means to provide periodic time indication on the record, and for simultaneously causing the record member to be relatively moved past the recording member even if the time indication occurs during one of the non-operative periods.

15. A chart recorder, comprising:
- an input terminal for receiving an electrical input signal a value of which is to be recorded;
- first drive means including circuitry and for relatively moving a length of record medium past a recording member at a selectable controlled rate; and
- second drive means including circuitry and connected to said input terminal for relatively moving the recording member across the record medium to a position dependent upon the value of said input signal;
- means for selectively operating the first drive means at a fast speed or a slow speed and obtaining the slow speed by intermittent operation at the fast speed, and means responsive to selection of the slow-speed condition for disconnecting, during the non-operative periods, at least some of said circuitry from its power supply, whereby power consumption is reduced.

16. A recorder according to claim 15, wherein at least one of said drive means includes a drive motor provided with a velocity control circuit.

17. A recorder according to claim 16, wherein said velocity control circuit comprises a memory circuit having an input connected to said motor through a first switch and an output connected to a comparator which also receives a motor control signal, the comparator output being applied to said motor through a second switch and a power amplifier, wherein said first and second switches are closed alternately.

* * * * *

UNITED STATES PATENT OFFICE
CERTIFICATE OF CORRECTION

Patent No. 4,215,351　　　　　Dated July 29, 1980

Inventor(s) David John Lowe

It is certified that error appears in the above-identified patent and that said Letters Patent are hereby corrected as shown below:

Col. 8, line 46; before "with" insert ---provided---.

Col. 9, line 14; after "provide" insert ---a---.

Signed and Sealed this

Fourth Day of November 1980

[SEAL]

Attest:

SIDNEY A. DIAMOND

Attesting Officer　　　Commissioner of Patents and Trademarks